United States Patent
McIntyre et al.

(10) Patent No.: US 8,592,346 B2
(45) Date of Patent: Nov. 26, 2013

(54) TEXTURED POWDER WIRES

(75) Inventors: Peter M. McIntyre, College Station, TX (US); Kyle C. Damborsky, College Station, TX (US); Nathaniel J. Pogue, College Station, TX (US)

(73) Assignee: The Texas A&M University System, College Station, TX (US)

( * ) Notice: Subject to any disclaimer, the term of this patent is extended or adjusted under 35 U.S.C. 154(b) by 73 days.

(21) Appl. No.: 13/195,669

(22) Filed: Aug. 1, 2011

(65) Prior Publication Data

US 2012/0028809 A1 Feb. 2, 2012

Related U.S. Application Data

(60) Provisional application No. 61/370,066, filed on Aug. 2, 2010.

(51) Int. Cl.
*H01L 39/24* (2006.01)

(52) U.S. Cl.
USPC .................. 505/430; 505/431; 505/433

(58) Field of Classification Search
USPC .......... 505/400, 430, 431, 433, 490, 492, 501
See application file for complete search history.

(56) References Cited

U.S. PATENT DOCUMENTS

| | | | | |
|---|---|---|---|---|
| 3,358,361 A * | 12/1967 | Kolbe | ............................ | 29/599 |
| 3,681,063 A * | 8/1972 | Douglass | ........................ | 419/27 |
| 4,148,129 A * | 4/1979 | Young | ............................ | 29/599 |
| 4,939,121 A * | 7/1990 | Rybka | ........................... | 505/400 |
| 5,073,209 A * | 12/1991 | Giancola | ....................... | 505/400 |
| 5,096,880 A * | 3/1992 | Rybka | ........................... | 505/400 |
| 5,114,905 A * | 5/1992 | Giessen et al. | ................. | 505/400 |
| 5,160,794 A * | 11/1992 | Wong et al. | .................... | 428/661 |
| 5,258,364 A * | 11/1993 | Yamazaki | ...................... | 505/400 |
| 5,262,396 A * | 11/1993 | Yamazaki | ...................... | 505/400 |
| 5,280,011 A * | 1/1994 | Kraitsberg | ..................... | 505/400 |
| 5,550,103 A | 8/1996 | Motowidlo et al. | | |
| 5,683,969 A | 11/1997 | Masur et al. | | |
| 5,827,798 A | 10/1998 | Matsubara et al. | | |
| 5,885,938 A | 3/1999 | Otto et al. | | |
| 5,908,812 A | 6/1999 | Cotton et al. | | |
| 5,942,466 A | 8/1999 | Li et al. | | |
| 5,964,966 A | 10/1999 | Goyal et al. | | |
| 6,069,116 A | 5/2000 | Li et al. | | |
| 6,074,991 A | 6/2000 | Jenovelis et al. | | |
| 6,106,615 A | 8/2000 | Goyal et al. | | |

(Continued)

OTHER PUBLICATIONS

Damborsky, et al., "Texturing of micaceous superconductor powder and fabrication of wire to preserve the texture," Manuscript Aug. 3, 2010; work supported in part by the U.S. Dept. of Energy under Grant DE-FG03-95ER40924; Darnborsky and Pogue are with the Texas A&M University Dept. of Physics; 4 pages.

(Continued)

*Primary Examiner* — Colleen Dunn
(74) *Attorney, Agent, or Firm* — Baker Botts L.L.P.

(57) ABSTRACT

A method for fabricating a wire from textured powder includes compressing a powder comprising a plurality of particles into a ribbon. The method further includes encasing the ribbon between two foil sheets to create a sheet of encased ribbon. The method additionally includes rolling the encased ribbon into a substantially cylindrical undrawn wire. The method further includes drawing the undrawn wire to create a substantially cylindrical wire having a diameter less than a diameter of the substantially cylindrical undrawn wire.

15 Claims, 4 Drawing Sheets

(56) References Cited

U.S. PATENT DOCUMENTS

| | | |
|---|---|---|
| 6,114,287 A | 9/2000 | Lee et al. |
| 6,170,147 B1 * | 1/2001 | Yamada et al. ............ 29/599 |
| 6,180,570 B1 | 1/2001 | Goyal |
| 6,185,810 B1 * | 2/2001 | Gubser et al. ............ 29/599 |
| 6,195,870 B1 | 3/2001 | Zhu et al. |
| 6,247,224 B1 * | 6/2001 | Li et al. ............ 29/599 |
| 6,253,096 B1 | 6/2001 | Balachandran et al. |
| 6,271,475 B1 | 8/2001 | Otto et al. |
| 6,295,716 B1 | 10/2001 | Rupich et al. |
| 6,308,399 B1 | 10/2001 | Zhou |
| 6,311,386 B1 | 11/2001 | Li et al. |
| 6,316,391 B1 | 11/2001 | Doi et al. |
| 6,331,199 B1 | 12/2001 | Goyal et al. |
| 6,340,657 B1 | 1/2002 | Arisawa et al. |
| 6,447,714 B1 | 9/2002 | Goyal et al. |
| 6,466,805 B2 | 10/2002 | Balachandran et al. |
| 6,555,256 B1 | 4/2003 | Christen et al. |
| 6,574,852 B2 | 6/2003 | Zhou |
| 6,599,346 B2 | 7/2003 | Goyal et al. |
| 6,602,313 B2 | 8/2003 | Goyal et al. |
| 6,607,838 B2 | 8/2003 | Goyal et al. |
| 6,607,839 B2 | 8/2003 | Goyal et al. |
| 6,610,413 B2 | 8/2003 | Goyal et al. |
| 6,610,414 B2 | 8/2003 | Goyal et al. |
| 6,613,270 B1 | 9/2003 | Li et al. |
| 6,620,768 B2 | 9/2003 | Rupich et al. |
| 6,635,097 B2 | 10/2003 | Goyal et al. |
| 6,790,253 B2 | 9/2004 | Goyal et al. |
| 6,797,030 B2 | 9/2004 | Goyal et al. |
| 6,846,344 B2 | 1/2005 | Goyal et al. |
| 6,890,369 B2 | 5/2005 | Goyal et al. |
| 6,902,600 B2 | 6/2005 | Goyal et al. |
| 6,943,550 B2 * | 9/2005 | Cheng et al. ............ 324/318 |
| 6,949,490 B2 | 9/2005 | Zhou |
| 7,087,113 B2 | 8/2006 | Goyal |
| 7,456,134 B2 * | 11/2008 | Upendran et al. ............ 505/431 |
| 7,572,754 B2 | 8/2009 | Wolf |
| 7,632,784 B2 * | 12/2009 | Rokhvarger et al. ............ 505/500 |
| 8,044,752 B2 | 10/2011 | Otto et al. |
| 8,173,579 B2 * | 5/2012 | Nakane et al. ............ 505/430 |
| 2009/0258787 A1 * | 10/2009 | Wilkie et al. ............ 505/231 |

OTHER PUBLICATIONS

H. Miao et al., "Microstructure and $j_c$ Improvements in Multifilamentary Bi-2212/Ag Wires for High Field Magnet Applications," CP986, Advances in Cryogenic Engineering: Transactions of the International Cryogenic Materials Conference—ICMC, vol. 54, AIP Conf. Proc. 986, 423 ©2008.

K. Damborsky et al., "Magnetic Orientation of Bi-2212 Powder," AIP Conf. Proc. 1219, 321 CP1219, Advances in Cryogenic Engineering: Transactions of the International Cryogenic Materials Conference—ICMC, vol. 56, ©2010.

J. B. Shi et al., "Anisotropy in Normal-State Magnetic Susceptibility of c-axis Aligned Bi-2223 Powders," Physica C212, 372, ©1993 Elsevier Science Publishers B.V.

D. C. Johnson et al., "Magnetic-Susceptibility Anisotropy of Single-Crystal $Bi_2Sr_2CaCu_2O_8$," Phys. Rev. B42, 8710, ©1990 The American Physical Society.

M. Rikel, Nexans Superconductors GmbH, private communication, http://www.ifw-dresden.de/nespa/partners/nsc/. Downloaded Jan. 11, 2012.

P. N. Mikheenko et al., "BSCCO" in Handbook of Superconduct. Mat., v. 1, pp. 947-989, Inst. of Phys. Publishing, ©2003 IPO Publishing Ltd.

P. Sen et al., "The Study of Texturing of Bi-2212 and Bi-2223 Superconductors as a Function of Pelletisation Pressure," Physica C255, 306, ©1995 Elsevier Science B.V.

Roll Compaction, The Fitzpatrick Company, 2010.

Low Capacity Dry Granulation, The Fitzpatrick Company, 2010.

Dry Granulation Model IR520, The Fitzpatrick Company, 2010.

W. K. McDonald et al., "Manufacture and Evaluation of $Nb_3Sn$ Conductors Fabricated by MJR Method," IEEE Trans. Mag. 19, 3, 1134, ©1983 IEEE.

* cited by examiner

TEXTURED POWDER WIRES

RELATED APPLICATIONS

This application claims the benefit under 35 U.S.C. §119 (e) of U.S. Provisional Application Ser. No. 61/370,066, filed Aug. 2, 2010 and entitled "Method and System for Fabricating a Wire from Textured Powder."

TECHNICAL FIELD OF THE INVENTION

The present disclosure relates generally to wires and more particularly to textured powder wires.

BACKGROUND

Three materials commonly used in fabricating superconducting wires are bismuth (Bi) 2212, Bi-2223, and yttrium barium copper oxide (YBCO). Of these, Bi-2223 and YBCO have been fabricated as a ribbon shaped wire. Bi-2212 powder has been deposited on ribbons using a slurry deposition followed by rolling to compress the slurry deposited powder. Bi-2212 has also been fabricated as a round multifilament wire in long piece length. One technique used to make such a wire is referred to as oxide-powder-in-tube (OPIT). OPIT starts with a silver tube that is filled with a phase-pure powder of Bi-2212 ground to micron particle size. The powder is compressed within the tube and then both ends of the tube are sealed to form a billet. The billet is then drawn on a drawbench. This is repeated for multiple billets. The drawn billets are then inserted into a larger silver tube and re-stacked in a symmetric stack. This is then drawn again to form a multifilament wire. The wire is typically drawn to an overall diameter of 0.8 mm.

SUMMARY

The teachings of the present disclosure relate to a method for fabricating a wire from textured powder. The method includes compressing a powder comprising a plurality of particles into a ribbon. The method further includes encasing the ribbon between two foil sheets to create a sheet of encased ribbon. The method additionally includes rolling the encased ribbon into a substantially cylindrical undrawn wire. The method further includes drawing the undrawn wire to create a substantially cylindrical wire having a diameter less than the diameter of the substantially cylindrical undrawn wire.

Technical advantages of particular embodiments may include providing a round wire from flat ribbons of textured powder. The round wire may be able to carry superconducting current through the textured powder. Other features and technical advantages will be readily apparent to one of ordinary skill in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of particular embodiments and their advantages, reference is now made to the following description, taken in conjunction with the accompanying drawings, in which.

DETAILED DESCRIPTION

Figure 1A:
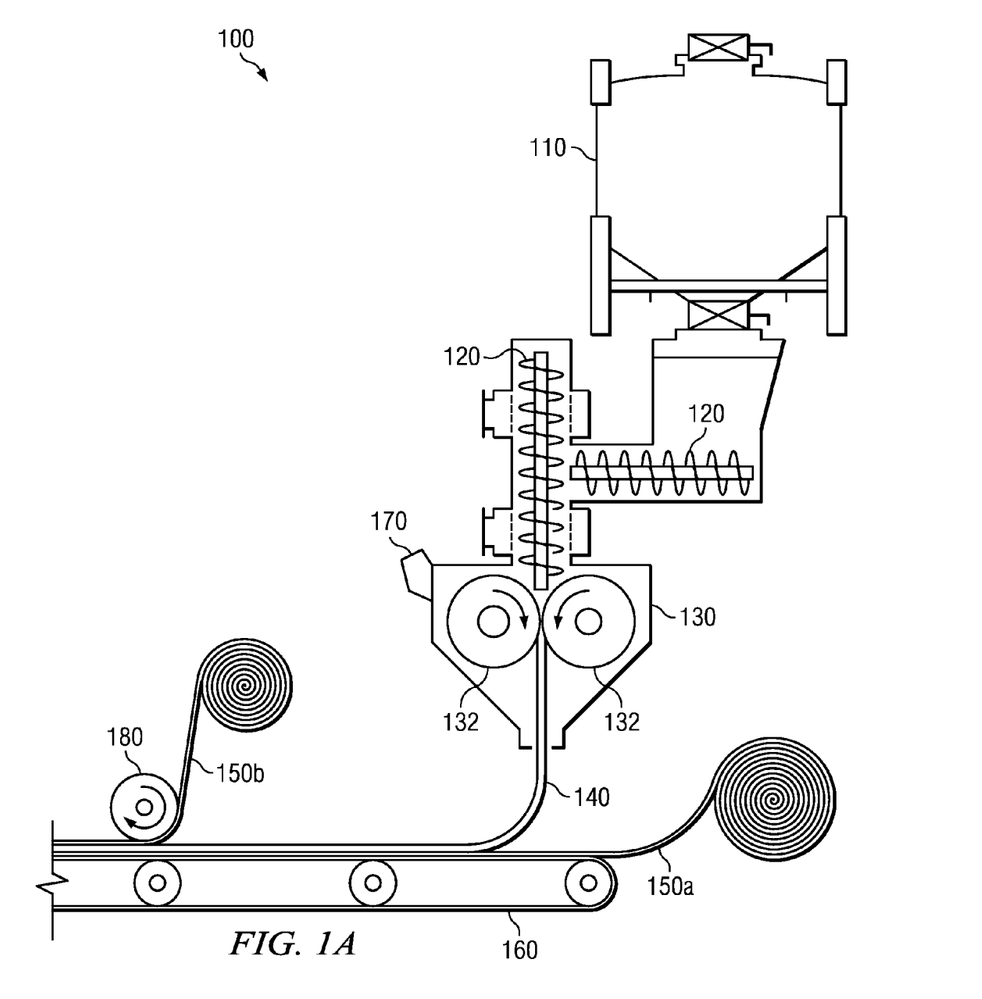
FIGS. 1A-1C depict block diagrams of components of a system configured to produce textured powder wires, in accordance with certain embodiments.
Figure 1B:
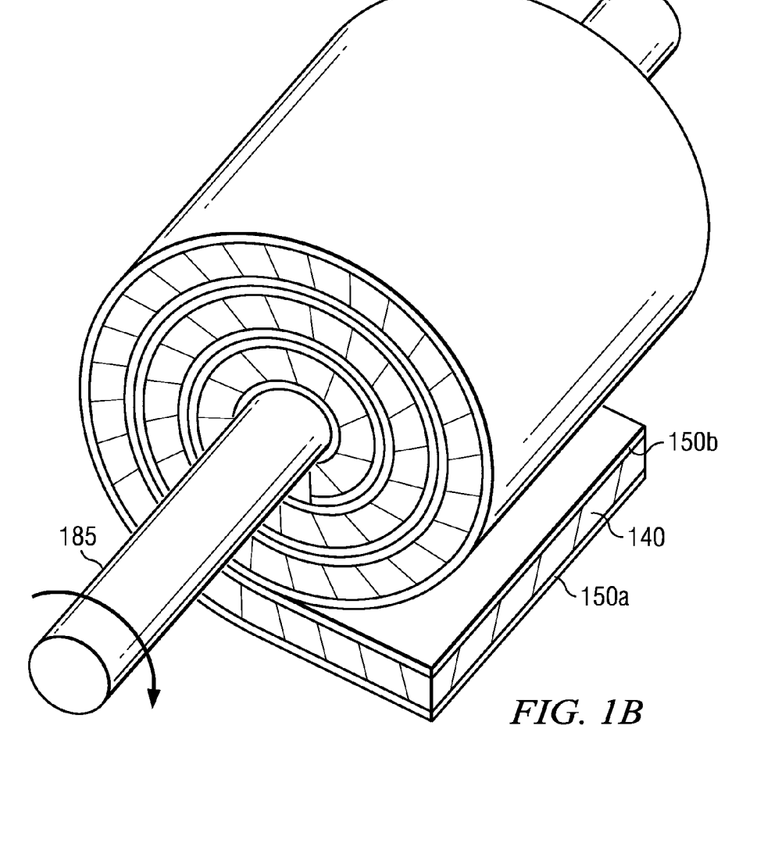
Figure 1C:
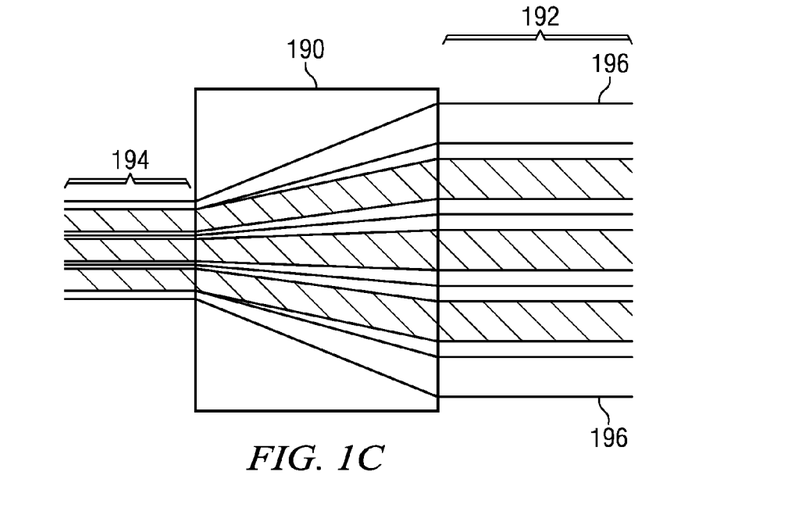

FIGS. 1A-1C depict block diagrams of components of a system configured to produce textured powder wires, in accordance with certain embodiments. System 100 comprises hopper 110, feeder 120, compressor 130, conveyor 160, applicator 180, roller 185, and drawbench 190. The depicted components of system 100 may be configured to fabricate a superconducting wire by rolling one or more relatively flat ribbons of compressed powder into a substantially cylindrical wire. In certain embodiments, the compressed powder may be able to carry superconducting current, thereby making the wire able to carry superconducting current.

Hopper 110 may comprise any suitably sized or shaped hopper configured to store the powder used to fabricate ribbon 140. In some embodiments, hopper 110 may store a micaceous high-temperature superconducting powder having a perovskite crystal phase (e.g., Bi-2212 or Bi-2223). When the particles of the powder are broken or ground they may tend to split along a particular crystal plane. Thus, the particles tend to form small thin sheets (as opposed to more spherical shapes). Supercurrent may flow along the oxide planes (e.g., along the sheets) in the crystal structure. Thus, with respect to the broken Bi-2212 particles, the supercurrent flows in the same plane that forms the cleavage plane.

Feeder 120 may comprise any suitable device configured to transport the powder from hopper 110 to compressor 130. In the depicted embodiments, feeder 120 comprises a horizontal screw feeder and a vertical screw feeder. Some examples of other types of feeders may include a conveyor belt feeder, a vibrating or oscillating feeder, a gravity feeder, or a vacuum tube feeder. In particular embodiments, feeder 120 may be able to aid in aligning the flat surfaces of the particles of the powder before they reach compressor 130. In some embodiments, feeder 120 may be configured to transport the powder in a liquid. The combination of the powder and the liquid may be referred to as a slurry. Depending on the embodiment, the slurry may be formed and stored in hopper 110. In some embodiments, the slurry may be formed on demand. For example, the powder and the liquid may be stored separately and then mixed as needed to form ribbon 140.

In particular embodiments, system 100 may align the particles of the powder in a certain direction. This may be referred to as texturing. The more aligned the particles are within the powder, the more textured the powder may be. Transporting the particles within the slurry may make aligning the particles easier because the particles may be able to move more easily when they are in the slurry. The alignment, or texturing, of the powder may be facilitated by the type of compressor used and, in some embodiments, by electric field generator 170 (or a magnetic field generator). For example, the spacing and rotation of rollers 132 may tend to align the particles of the powder such that the particles pass between rollers 132 with their flat surfaces parallel to the compressing surfaces of rollers 132.

In some embodiments, electric field generator 170 may be used to help align the particles in the powder before or during compression by compressor 130. For example, an electric field may be created between rollers 132. In some embodiments, the thin sheet geometry of the particles may create boundary conditions that result in an electric polarization directed out of the flat surface of the particles. The electric field generated by electric field generator 170 may create an electric torque on the particles of the powder. The force of the electric torque may be greater for particles whose flat surface is parallel to the electric field (e.g., whose electric polarization points perpendicularly to the electric field), as compared to particles whose flat surface is perpendicular to the electric field. This may help to align the particles such that the flat surfaces of the particles are aligned perpendicular to the electric field. By generating the electric field between rollers 132 (or otherwise perpendicular to the flow of the powder through compressor 130), the electric field may aid in texturing the resulting ribbon such that a relatively large portion of the particles are aligned with their flat surfaces substantially parallel to the wide flat surface of ribbon 140. In some embodiments, the electric field may also charge the particles. The charged particles may experience an electric force that attracts them to one or both of rollers 132.

In some embodiments, instead of, or in addition to, using electric field generator 170, a magnetic field generator may be used to create a magnetic field that may be used to help align the particles in the powder. For example, a magnetic field may be directed between rollers 132. The magnetic field may enhance the alignment of the powder particles through the magnetic torque that is created by the magnetic field acting on misaligned particles in a similar fashion to the electric field generated by electric field generator 170.

Figure 2:
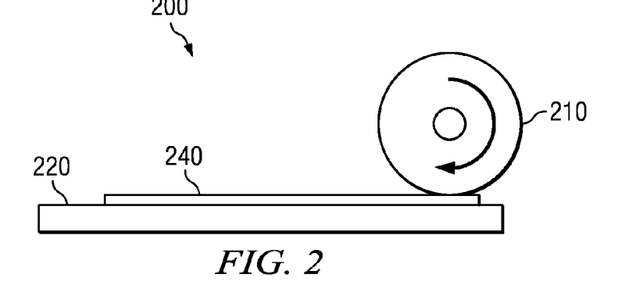
FIG. 2 depicts a block diagram of an alternate compressor, in accordance with certain embodiments.

Compressor 130 may comprise any suitable device configured to compress a powder into ribbon 140 of compressed powder. In some embodiments, compressor 130 may be configured to continuously compress the powder into ribbon 140. In FIG. 1A compressor 130 comprises a pair of counter-rotating rollers 132. Rollers 132 may comprise substantially smooth surfaces spaced at between approximately 6.5 and 0.5 mm apart. The spacing between rollers 132 may be adjusted to correspond to the desired thickness of ribbon 140. In some embodiments, rollers 132 may be configured in a tongue and groove arrangement in which the tongue of one of the rollers compresses the powder within the groove of the other roller. The width of the tongue and groove may correspond to the width ribbon 140. In some embodiments, rollers 132 may comprise several tongue and groove pairs configured to simultaneously create several narrower ribbons. FIG. 2 depicts an alternate compressor 200 in which the powder from feeder 120 may be compressed between roller 210 and flat surface 220 to produce ribbon 240.

Figure 3A:
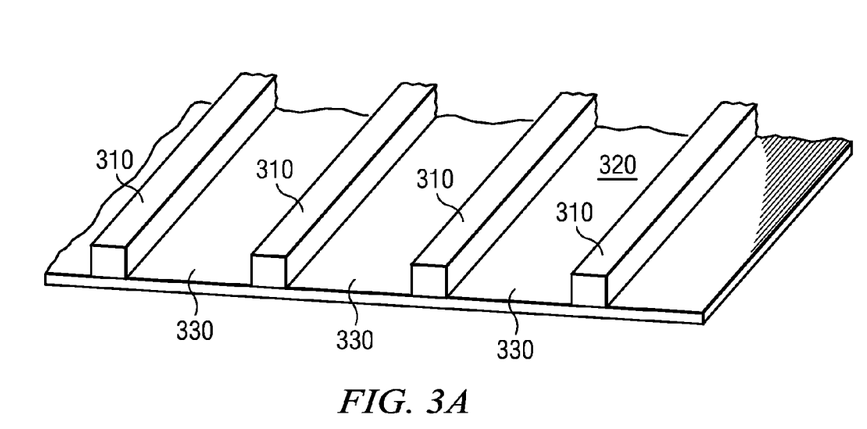
FIGS. 3A and 3B depict a perspective view of multiple ribbons of compressed textured powder within multiple ribbon troughs of a foil sheet, in accordance with particular embodiments.

Regardless of the type of compressor used, compressor 130 may produce a continuous ribbon of textured and aggregated superconducting powder. Ribbon 140 may comprise a thin uniformly thick ribbon of compressed textured powder made up of small aligned particles. Depending on the embodiment, ribbon 140 may comprise a single wide ribbon or multiple narrower ribbons. The multiple narrower ribbons may be formed when ribbon 140 emerges from compressor 130 or at a point after ribbon 140 emerges from compressor 130. For example, in some embodiments, a single wide ribbon may emerge from compressor 130. The wide ribbon may then be cut into smaller ribbons. The smaller ribbons may be sized so as to fit between ribs (e.g., ribs 310) fabricated on foil sheet 150*a*.

Depending on the embodiment and/or operational needs, ribbon 140 may have a width between approximately 80 cm and 0.5 mm and a thickness between approximately 6.5 and 0.5 mm. For example, in some embodiments ribbon 140 may have a width of approximately 60 cm and a thickness of approximately 1 mm. The dimensions used may vary depending on the application parameters for the resulting textured powder wire. Similarly, ribbon 140 may be made to any desirable length based on operational needs.

Foil sheet 150*a* may have similar, but slightly larger, dimensions than ribbon 140. Foil sheet 150*b* may be sized similar to foil sheet 150*a*. Depending on the embodiment, foil sheets 150 may be made of any of a variety of different conducting metals. For example, in some embodiments foil sheets 150 may be made of silver or oxide dispersion strengthened silver alloys. As ribbon 140 emerges from compressor 130 it may be placed on foil sheet 150*a*. Foil sheet 150*a* may be drawn from its source by conveyor 160. Conveyor 160 may move at a speed that corresponds to the rate at which compressor 130 is able to form ribbon 140. This may allow foil sheet 150*a* to continuously receive ribbon 140 until a desired length of ribbon 140 has been produced.

Applicator 180 may be configured to apply foil sheet 150*b* over ribbon 140 to encase ribbon 140 between foil sheets 150. In particular embodiments, the edges of foil sheets 150 may be sealed together, thereby encasing ribbon 140 within a cavity between foil sheets 150. The edges may be sealed by applicator 150 as it applies foil sheet 150*b* or after the fact (e.g., by a welder configured to weld foil sheets 150 together). In some embodiments, applicator 180 may be configured to apply foil sheet 150*b* at a rate corresponding to the rate of conveyor 160.

In certain embodiments, a rod, such as rod 185, may be attached to one of the sealed edges. Rod 185 may be made of the same or different material as foil sheets 150. The edges of the foil sheets 150 may be sealed together along their length. For example, in some embodiments foil sheets 150 may be sealed by laser-welding the margin of foil sheets 150 that is beyond the edges of ribbon 140. In some embodiments, only one foil sheet may be used. The single foil sheet may be more than twice as wide as ribbon 140. In such an embodiment, the single foil sheet may be folded over ribbon 140 and then sealed along the margins of its two edges. In some embodiments, the single foil sheet may not encase ribbon 140 until it is rolled into a substantially cylindrical undrawn wire.

In FIG. 1B ribbon 140, encased between foil sheets 150, is wound around rod 185 to form an undrawn wire. Rod 185 may be a solid metal rod made of material that is the same as, similar to, or different than the material of foil sheets 150. For example, rod 185 may be made of silver. Rod 185 may be as long as or longer than ribbon 140. In some embodiments, rod 185 may be attached to one of the sealed edges of foil sheets 150. This may allow rod 185 to serve as the core about which ribbon 140 and foil sheets 150 are rolled to form a substantially cylindrical undrawn wire. In such a scenario, rod 185 may be the center of a spiral arrangement of ribbon 140 encased in foil sheets 150. For example, once rod 185 is attached to one of the sealed edges of foil sheets 150, rod 185 may be rotated and ribbon 140 encased in foil sheets 150 may be wrapped tightly around rod 185. In some embodiments, rod 185 may be the center of a plurality of loops of ribbon 140 encased in foil sheets 150. For example, a rod may be attached to a sealed edge of a narrow strip of ribbon encased in foil sheets. The encased ribbon may then be wrapped around the rod such that the two sealed edges of the narrow strip are touching. Each subsequent strip of encased ribbon may be wider than the previous such that it may be wrapped around the previously wrapped strip.

In particular embodiments, once ribbon 140 encased in foil sheets 150 has been formed into a substantially cylindrical form, it may then be inserted into a metal tube. The metal tube may be made of a similar metal as foil sheets 150 (e.g., a silver tube) or it may be made from a different material. In some scenarios, the metal tube may be hardened. In certain embodiments, the tube may be longer than ribbon 140. In some embodiments, the ends of the tube may be sealed.

In some embodiments, a jacket may be used with, or instead of, the tube. FIG. 1C depicts a scenario in which jacket 196 is used. Jacket 196 may be used to facilitate drawing the undrawn wire while minimizing the disruption of the structure of the undrawn wire. In certain embodiments, jacket 196 may comprise a ductile and strong material, such as copper. This may improve the draw-down performance. In some embodiments, jacket 196 may be removed without disturbing the structure of the wire (e.g., chemically etched away).

Drawing bench 190, depicted in block diagram form in FIG. 1C, illustrates a cutaway view of a drawing bench. Drawing bench 190 may be configured to further compress the powder in the ribbon and to narrow the diameter of the resulting wire. Undrawn wire 192 may be inserted in a hardened tube and/or jacket 196. The jacketed undrawn wire 192 may then be drawn through drawing bench 190 which may compress undrawn wire 192 as it draws its diameter down to form drawn wire 194. A wire may be drawn through a series of increasingly smaller drawing benches until drawn wire 194 comprises the desired diameter. Depending on the embodiment, a wire may be drawn through drawing bench 190 by fine-wire drawing or by 'pull-trusion.' In 'pull-trusion' undrawn wire 192 is simultaneously drawn and extruded isostatically through drawing bench 190. The drawn wire could be used as-is or it may be stacked with other drawn wires within another tube or jacket and then re-drawn to make a multi-filament stack.

In certain embodiments, the textured micaceous powder compressed into ribbon 140 may facilitate drawing undrawn wire 192. For example, in certain situations, as undrawn wire 192 is drawn the particles in the powder may re-arrange themselves to accommodate the area reduction. In doing so, the particles may slide upon one another in the drawing direction because the powder is textured in the same direction as the drawing direction. The particles may slide upon one another even while under compression as they are drawn through drawing bench 190.

Though not depicted in FIGS. 1A-1C, certain embodiments may include a current source or a voltage source configured to pass current through a drawn wire. The current may be used to add heat to the drawn wire to achieve any one of a variety of conditions. Some embodiments may use other hear sources. One example condition achieved with the heat may be a condition of solid phase diffusion. Solid phase diffusion may occur at a temperature just below the melt temperature of the solid phase powder. When held at this temperature, the particles of the powder do not melt but the constituent atoms readily diffuse within each particle and between particles. This may cause the particle of the powder to grow in the a-b planes (the flat surface) of the crystal structure and to shrink in the c direction (the thickness). The solid phase diffusion may also cause adjacent particles to fuse together where their crystal structures touch, increasing the densification of the powder layer. This may improve the transport of superconducting currents in the powder layer once a wire containing the re-formed powder is cooled below the critical temperature for superconductivity.

Another example condition that may be achieved by heating the wire is to fully melt the particles of the textured powder. A full melt may be suitable when solid phase diffusion proves inadequate to connect the individual particles of the powder. One disadvantage of a full melt is that when, Bi-2212 for example, melts, it may decompose into several different solid and liquid phases. A second disadvantage is that the equilibrium concentration of oxygen in the melt is less than the amount of oxygen that resides in the solid powder phase. The released oxygen needs to be able to diffuse rapidly out from the interior of the wire, without causing it to form an embolism. When the wire is cooled again the oxygen needs to be able to diffuse back in to the re-forming Bi-2212 crystallites. The formed dendritic crystallites may alter the alignment of the particles of ribbon 140. Moreover, a full melt may require the use of silver for foil sheets 150 and/or rod 185. Silver is permeable to oxygen at high temp, and does not itself oxidize at those temperatures.

Another example condition that may be achieved by heating the wire is to partially melt the powder by raising its temperature just to the melt temperature. This may be done by controlling or limiting the amount of heat that is added to the drawn wire. This may allow for a partial melt of the textured powder. Because the powder is only partially melted, as opposed to fully melted, the growth of dendritic crystallites may be avoided. In certain embodiments, by only partially melting the compressed powder, it may be possible to create a textured powder wire that does not use silver for foil sheets 150, rod 185 and/or an external tube or jacket 196. This may be because without melting the textured powder, there may not be a need for the silver components to allow the oxygen to breath.

In certain embodiments, a completed textured powder wire may comprise particles that are stacked like bricks with their flat faces parallel and touching. This may allow the wire to be joined to touch points by annealing at much lower temperature (compared to using OPIT wire). For example, in some embodiments the wire may be joined using solid-phase diffusion well below the melting temperature of the powder. This may allow for healthier interconnects to be made by, for example, avoiding the formation of parasitic phases that may occur from the melting of the particles. Because the powder is not required to melt and re-crystallize, it may be possible to fabricate the wire without using silver. Rather, a more cost effective matrix metal may be used for the foil sheets, core rod and/or outer tube.

Figure 3B:
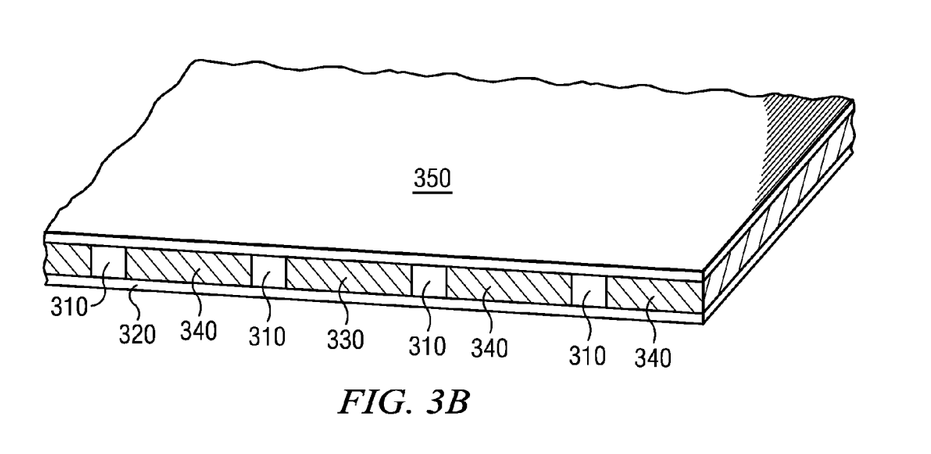

FIGS. 3A and 3B depicts a perspective view of multiple ribbons 340 of compressed textured powder within multiple ribbon troughs 330 of foil sheet 320. Ribbons 340 are separated by ribs 310. In some embodiments, ribs 310 may be fabricated by laser-welding square-cross-section wire to foil sheet 320. Once attached, ribs 310 may form channels or troughs 330 into which multiple strips of ribbon 340 are received. These troughs 330 may create separate cores or cavities that, when filled with textured powder, may provide multiple paths for supercurrent to flow along the length of the textured powder wire. This may improve the wires performance in applications where AC losses are a controlling issue. Ribs 310 may also provide stabilizing risers which may help to maintain uniformity of cross-section through the rolling and drawing processes. In certain embodiments, once the narrower strips of ribbon 340 have been placed in ribbon troughs 330, foil sheet 350 may be placed over ribs 310 to encase the individual ribbons 340. Foil sheet 350 may be substantially flat (e.g., without ribs).

Figure 4:
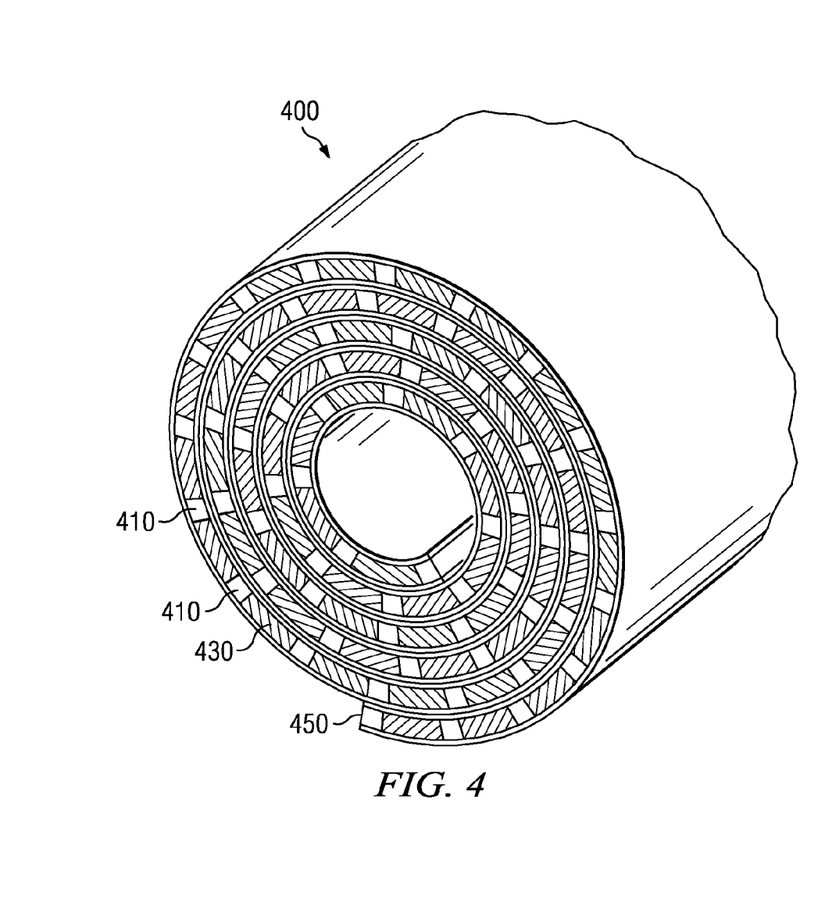
FIG. 4 depicts a perspective view of a rolled and undrawn wire comprising multiple ribbons of compressed textured powder, in accordance with particular embodiments.

FIG. 4 depicts a perspective view of a rolled and undrawn wire comprising multiple ribbons of compressed textured powder, in accordance with particular embodiments. Undrawn wire 400 comprises multiple ribbons 430 of compressed textured powder, such as superconducting powder (e.g., Bi-2212 or Bi-2223). Ribbons 430 may be separated from neighboring ribbons 430 on the left and right by ribs 410 and from neighboring ribbons 430 above and below by one or more layers of foil sheet 450. As can be seen, the cross section of undrawn wire 400 comprises ribbons 430 arranged in a substantially spiral pattern. Because ribbons 430 start as flat ribbons, the texturing of the compressed powder may be maintained when they are rolled into cylindrical undrawn wire 400. In some embodiments, before drawing undrawn wire 400, undrawn wire 400 may be inserted into a hardened sheath (e.g., a hardened silver sheath) and then drawn and re-stacked as needed.

Thus far several different embodiments and features have been presented. Particular embodiments may combine one or more of these features depending on operational needs and/or component limitations. Some embodiments may include additional or different features. Moreover, although particular embodiments have been described in detail, it should be understood that various other changes, substitutions, variations, modifications and alterations may be made hereto without departing from the spirit and scope of particular embodiments. For example, while this disclosure has focused on Bi-2212 and Bi-2223, other embodiments may comprise different superconducting powders, or other micaceous particles, such as YBCO. Particular embodiments contemplate great flexibility in the arrangement of these elements as well as their internal components.

Figure 5:
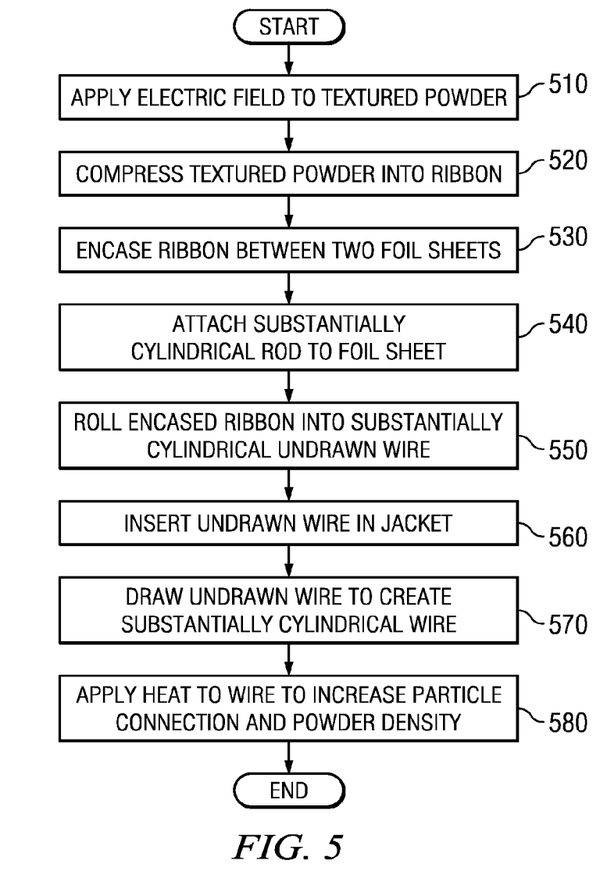
FIG. 5 depicts the steps of a method for producing textured powder wires, in accordance with particular embodiments.

FIG. 5 depicts the steps of a method for producing textured powder wires. For purposes of the depicted method, it may be assumed that a single ribbon of compressed powder is used to form a superconducting core of the textured powder wire, similar to the embodiment depicted in FIG. 1B, as opposed to the embodiments depicted in FIGS. 3 and 4.

The method begins at step 510 by applying an electric field to a powder. In some embodiments, the electric field may be applied between the components of a compressor responsible for compressing the powder. For example, in the embodiment depicted in FIG. 1A the electric field may be applied between rollers 132. In certain embodiments, the electric field may be applied to the powder before it reaches the compressor. The powder may comprise superconducting particles having a flat sheet like geometry. The electric field may be applied to align the particles of the powder before, or as, they are compressed into a ribbon. The electric field may align a relatively large portion of the particles such that the substantially flat surfaces of the particles are substantially perpendicular to the direction of the electric field. The electric field in turn may be aligned so that it is perpendicular to the path of the particles through the compressor. Thus, the electric field may help orient the particles such that the particles present their skinniest profile to the compressor.

In some embodiments, the powder may be in a slurry when the electric field is applied. For example, the powder may be added to a liquid prior to reaching the electric field. The liquid suspension of the slurry may allow the particles to move more freely than when not suspended in a liquid. While step 510 involves applying an electric field to the powder, other embodiment may comprise using a magnetic field to align the particles in the powder. In some embodiments, an electric field and a magnetic field may be applied to the particles to further align the particles prior to their being compressed.

At step 520 the powder is compressed into a ribbon of compressed textured powder. The compressive forces of the compressor may further align the particles of the powder as they are being compressed into the ribbon. In some embodiments, the powder may be compressed between two counter-rotating rollers. The rollers may be spaced between approximately 6.5 and 0.5 mm apart. This may allow the rollers to produce an evenly thick ribbon between approximately 6.5 and 0.5 mm. In some embodiments, the two rollers may be substantially smooth circular cylinders. In certain embodiments, the rollers may comprise a tongue and groove configuration in which one roller fits within a channel of a second roller. This may allow for a controlled width of the ribbon. That is, the width of the ribbon of compressed textured powder may correspond to the width of the tongue portion of one of the rollers. In particular embodiments, the powder may be compressed into a ribbon between a single rotating roller and a hard, flat, and smooth surface. Other embodiments may use other types of compressors. In certain embodiments, the compressor may be able to form a ribbon of any given length, as long as it is fed with the powder to be compressed. This may allow for the production or fabrication of textured powder wires of any desired length. In some embodiments, the edges of the ribbon may be trimmed to provide straight edges. In some embodiments the ribbon may be cut into narrower strips, or the compressor may be configured to produce several narrow strips simultaneously (e.g., several tongue and grove pairs).

At step 530 the ribbon is encased between two foil sheets. Although this embodiment comprises encasing the ribbon between two foil sheets, in certain embodiments, the ribbon may be encased within a single foil sheet. For example, a single foil sheet may be folded in half to encase the ribbon. As another example, the ribbon may be encased when the single foil sheet and ribbon are rolled at step 550. As the compressed powder leaves the compressor through step 520, the ribbon may be received by a conveyor belt that is currently conveying the at least one foil sheet. This may allow the ribbon of compressed textured powder to be received on top of a moving foil sheet. The movement of the foil sheet may correspond to the rate at which the ribbon is produced. This may prevent the ribbon from collecting into a pile or tearing as it leaves the compressor.

The compressed ribbon and the foil sheet may continue to be moved by the conveyor until a suitable length (e.g., based on the desired length of the finished textured powder wire) of compressed powder has been deposited on to the foil sheet. At this time the compressed ribbon and foil sheet may be cut to the desired length. A second foil sheet may then be applied to cover the compressed powder. The two sealed foil sheets may encase the ribbon. The second foil sheet may be sealed to the first foil sheet along the two lengths of the foil sheet. For example, in some embodiments, the two edges of the foil sheets on each side of the ribbon of compressed powder may be laser welded together.

At step 540 a substantially cylindrical rod may be attached to the two foil sheets. The cylindrical rod may be attached by, for example, laser welding the cylindrical rod to one of the edges of the two foil sheets (e.g., one of the two edges that were sealed at step 530). The cylindrical rod may be attached lengthwise to the encased ribbon. That is, the length of the cylindrical rod may correspond to the length of the ribbon which may correspond to the desired length of textured powder wire to be fabricated. The cylindrical rod may be made of a similar or different material to the two foil sheets. For example, both the cylindrical rod and the two foil sheets may be made out of silver. In certain embodiments, other metal materials may be used for the foil sheets and/or cylindrical rod. For example, copper, palladium, platinum, or oxide dispersion strengthened silver alloys may be used. In some embodiments, the metal used may depend on the powder. For example, in some instances it may not be desirable to use copper with Bi-2212 powder.

At step 550 the encased ribbon is rolled into a substantially cylindrical undrawn wire. The encased ribbon may be rolled around the attached substantially cylindrical rod, attached at step 540. The rolling of the encased ribbon may create a substantially spiral shaped undrawn wire. In some embodiments, steps 510 through 530 may be repeated forming increasingly wide strips of encased ribbon. In such an embodiment, the first and narrowest strip may be wrapped or rolled around the cylindrical rod. Subsequent wider strips may then be wrapped or rolled around the already rolled first strip. This may create a series of concentric rings of the encased ribbon wrapped around the central rod.

At step 560 the undrawn wire is inserted into a jacket. The jacket may be made of a different material from the foil sheets and the cylindrical rod. The jacket may be made of a stronger material that may allow the wire to maintain its structural integrity as it is drawn through the draw bench at step 570. The jacket may be made of material that is easily dissolved or removed from the wire once it has been drawn. In some embodiments, before the jacket is placed over the undrawn wire, a cylindrical tube may be placed around the undrawn wire. The cylindrical tube may be comprised of the same material used for the foil sheets and the cylindrical wire. For example, the foil sheets, cylindrical rod, and cylindrical tube may be made of silver and the jacket may be made of copper.

At step 570, the undrawn wire and jacket may be drawn through a draw bench to create a substantially cylindrical wire. The draw bench may reduce the diameter of the wire while increasing the compression of the compressed powder ribbon within the foil sheets. Moreover, because the particles of the ribbon have been aligned by the electric field at step 510 and the compression at step 520, the particles may slide along one another and fill in any gaps between themselves as they are pulled through the draw bench. This may further reduce the amount of empty space or gaps between superconducting particles. This may increase the amount and efficiency with which the wire is able to carry superconducting current.

At step 580 heat is applied to the drawn wire to increase particle connections and powder density. In some embodiments this may comprise applying heat to the wires to bring the powder close to the melting point without actually reaching or exceeding the melting point. The powder may then be held at this temperature for a certain amount of time (e.g., more than two hours) so that solid phase diffusion can promote crystal growth between the particles. This may increase densification and interconnections among the particles of the powder. In certain embodiments, heat may be applied to partially melt the plurality of particles. In certain embodiments, the heat may be added by passing electrical current through the wire. Sufficient current may be passed through the wire to bring the heat or temperature of the wire to, or just below, the melting point of the compressed powder. Because of the compressive forces being placed on the particles both by being compressed into a ribbon and by being drawn through the draw bench, there may be additional pressure on the particles where the particles are in contact with one another. This may result in these contact points being the first places to begin to melt as the wire is heated at, or just below the melting point of the powder. This may help to create a continuous path for superconducting current to flow through the powder without creating the parasitic phases that may occur during a full melt.

Although the steps above are arranged in a particular order and comprise a particular arrangement, other embodiments may involve different steps and different orders. For example, in some embodiments no heat may be added to the drawn wire. Similarly, in some embodiments heat may be added to the wire to fully melt the plurality of particles. As another example, in some embodiments, the undrawn wire may only be inserted into a cylindrical tube, without a jacket.

Some of the steps illustrated in FIG. 5 may be combined, modified or deleted where appropriate, and additional steps may also be added to the flowchart. Additionally, steps may be performed in any suitable order without departing from the scope of particular embodiments.

While various implementations and features are discussed with respect to multiple embodiments, it should be understood that such implementations and features may be combined, re-arranged or modified in various embodiments. For example, features and functionality discussed with respect to a particular figure, such as FIG. 1, may be used in connection with features and functionality discussed with respect to another such figure, such as FIG. 2, according to operational needs or desires.

Although particular embodiments have been described in detail, it should be understood that various other changes, substitutions, and alterations may be made hereto without departing from the spirit and scope of particular embodiments. For example, although an embodiment has been described with reference to a number of elements included within system 100, such as hoppers, feeders, compressors and conveyors, these elements may be combined, rearranged or positioned in order to accommodate particular textured powder wire fabricating needs. In addition, any of these elements may be provided as separate external components to system 100 or each other where appropriate. Particular embodiments contemplate great flexibility in the arrangement of these elements as well as their internal components.

Numerous other changes, substitutions, variations, alterations and modifications may be ascertained by those skilled in the art and it is intended that particular embodiments encompass all such changes, substitutions, variations, alterations and modifications as falling within the spirit and scope of the appended claims.

What is claimed is:

1. A method for fabricating a superconducting wire including a textured powder of superconducting material within a metal matrix, comprising:
   producing a textured powder core by compressing a plurality of micaceous particles into a plurality of aligned particles and forming the textured power core into a cohesive square or rectangular bar;
   encasing the formed cohesive square or rectangular bar of textured powder core between two foil sheets to create a sheet of encased textured powder core;
   rolling the encased texture powder core into a substantially cylindrical undrawn wire;
   drawing the undrawn wire to create a substantially cylindrical wire having a diameter less than a diameter of the substantially cylindrical undrawn wire.

2. The method of claim 1, further comprising extruding the undrawn wire before drawing the undrawn wire.

3. The method of claim 1, wherein the plurality of micaceous particles comprises Bi-2212.

4. The method of claim 1 wherein the plurality of micaceous particles comprises Bi-2223.

5. The method of claim 1, further comprising applying an electric field to the plurality of micaceous particles as they are compressed into a textured powder core.

6. The method of claim 1, further comprising applying a magnetic field to the plurality of micaceous particles as they are compressed into a textured powder core.

7. The method of claim 1, wherein compressing a plurality of micaceous particles into a plurality of aligned particles and forming the textured powder core into a cohesive square or rectangular bar comprises feeding the plurality of micaceous particles between two rollers rotating in opposite directions.

8. The method of claim 1, wherein compressing a plurality of micaceous particles and forming the textured powder core into a cohesive square or rectangular bar comprises compressing the plurality of micaceous particles between a set of male and female dies that confine the powder laterally while applying uniaxial compression.

9. The method of claim 1, further comprising, adding heat to the wire to partially melt the plurality of particles.

10. The method of claim 2, and further comprising placing the undrawn wire in a cylindrical jacket prior to drawing the undrawn wire, wherein the cylindrical jacket has a ductility and strength greater than the ductility and strength of the foil.

11. The method of claim 10, further comprising removing the jacket by grinding and/or chemical etching.

12. The method of claim 1, further comprising adding at least one of heat and hydrostatic pressure to the wire to stimulate solid phase diffusion.

13. The method of claim 1:
further comprising forming one or more additional textured powder cores; and
wherein encasing the textured powder cores between two foil sheets comprises:
 placing the textured powder core and the one or more additional textured powder cores on a first foil sheet of the two foil sheets, the first foil sheet comprising a plurality of raised ribs forming two or more troughs, each one of the textured powder cores and the one or more additional textured powder cores placed in a different trough; and
 covering the textured powder core, the one or more additional textured powder cores, and the raised ribs with a second foil sheet of the two foil sheets.

14. The method of claim 1:
further comprising attaching a substantially cylindrical rod to at least one of the two foil sheets encasing the textured powder core;
wherein roiling the encased textured powder core into a substantially cylindrical undrawn wire comprises transversely rolling the sheet of encased textured powder core around the substantially cylindrical rod to form the substantially cylindrical undrawn wire.

15. The method of claim 14, wherein the cylindrical rod is made from a different material than the two foil sheets.

* * * * *